(12) United States Patent
Kim et al.

(10) Patent No.: US 7,881,148 B2
(45) Date of Patent: Feb. 1, 2011

(54) SEMICONDUCTOR MEMORY DEVICE

(75) Inventors: Kyung-Hoon Kim, Gyeonggi-do (KR);
Sang-Sic Yoon, Gyeonggi-do (KR);
Hong-Bae Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 81 days.

(21) Appl. No.: 12/277,650

(22) Filed: Nov. 25, 2008

(65) Prior Publication Data

US 2009/0303827 A1 Dec. 10, 2009

(30) Foreign Application Priority Data

Jun. 5, 2008 (KR) .................. 10-2008-0053318

(51) Int. Cl.
*G11C 8/00* (2006.01)
*G11C 8/18* (2006.01)
*H03K 3/017* (2006.01)

(52) U.S. Cl. .............................. 365/233.1; 365/189.11; 365/233.12; 327/175

(58) Field of Classification Search ............... 365/233.1
See application file for complete search history.

(56) References Cited

U.S. PATENT DOCUMENTS

| 5,703,513 | A * | 12/1997 | Hashizume et al. | ......... 327/202 |
| 5,757,218 | A * | 5/1998 | Blum | ......................... 327/175 |
| 5,926,434 | A | 7/1999 | Mori et al. | |
| 6,232,811 | B1 | 5/2001 | Ihm et al. | |
| 6,529,423 | B1 | 3/2003 | Yoon et al. | |
| 6,570,815 | B2 * | 5/2003 | Kashiwazaki | .......... 365/233.17 |
| 7,227,809 | B2 * | 6/2007 | Kwak | ..................... 365/189.15 |
| 7,279,946 | B2 * | 10/2007 | Minzoni | ..................... 327/158 |
| 7,352,219 | B2 * | 4/2008 | Minzoni | ..................... 327/175 |
| 7,535,270 | B2 * | 5/2009 | Lee et al. | ..................... 327/147 |
| 7,633,324 | B2 * | 12/2009 | Yun et al. | .................... 327/160 |
| 7,642,828 | B2 * | 1/2010 | Sakai | ......................... 327/175 |
| 2002/0070752 | A1 * | 6/2002 | Harrison | ...................... 326/29 |
| 2006/0220714 | A1 * | 10/2006 | Hur | ............................. 327/175 |
| 2009/0091354 | A1 * | 4/2009 | Aoki | ........................... 327/65 |
| 2009/0091364 | A1 * | 4/2009 | Aoki | .......................... 327/175 |
| 2009/0231006 | A1 * | 9/2009 | Jang et al. | .................... 327/175 |
| 2009/0243677 | A1 * | 10/2009 | Becker et al. | ............... 327/158 |
| 2009/0279378 | A1 * | 11/2009 | Kwon et al. | ............. 365/233.1 |

FOREIGN PATENT DOCUMENTS

| JP | 09-074337 | 3/1997 |
| KR | 1020050087286 A | 8/2005 |

OTHER PUBLICATIONS

Notice of Preliminary Rejection issued from Korean Intellectual Property Office on Jun. 29, 2009 with an English Translation.

* cited by examiner

*Primary Examiner*—Son L Mai
(74) *Attorney, Agent, or Firm*—IP & T Group LLP (57) ABSTRACT

A semiconductor memory device includes a clock supply portion for providing an external clock to the interior of the memory device, a clock transfer portion for transferring the clock from the clock supply portion to each of elements in the memory device and data output portions for outputting data in synchronism the clock from the clock transfer portion, wherein the clock from the clock supply portion to the clock transfer portion swings at a current mode logic (CML) level.

16 Claims, 6 Drawing Sheets

CMOS LEVEL

CML LEVEL

SEMICONDUCTOR MEMORY DEVICE

CROSS-REFERENCE TO RELATED APPLICATION

The present invention claims priority of Korean patent application number 10-2008-0053318, filed on Jun. 5, 2008, which is incorporated by reference in its entirety.

BACKGROUND OF THE INVENTION

The present invention relates to a semiconductor memory device, and more particularly, to a technology of enhancing characteristics of a clock through an improved distribution of the clocks of the memory device.

Figure 1:
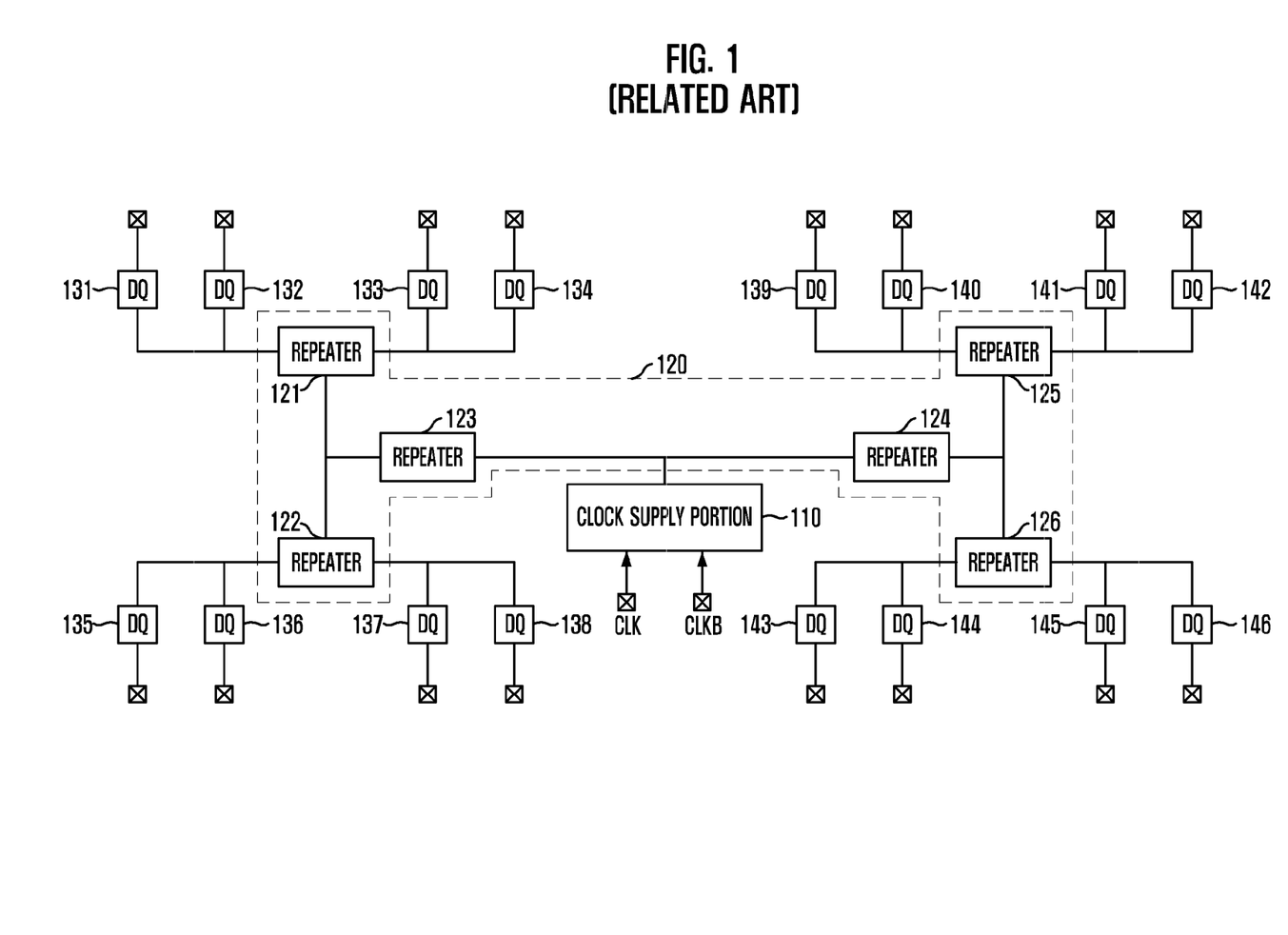
FIG. 1 is a diagram showing a clock distribution network of a conventional GDDR5 semiconductor memory device.

FIG. 1 shows a clock distribution network of a conventional ultra-high speed semiconductor memory device.

Shown in FIG. 1 is a clock supply portion 110 for supplying a clock provided from outside of a chip to the inside of a memory device. The clock supply portion 110 includes among its elements a buffer for receiving a clock from the outside, a phase locked loop (PLL) for generating a clean clock when high jitter exists in the clock, and a duty cycle correction (DCC) circuit for correcting the clock when there is a mismatch between its duty cycles.

Also shown in the drawing is a clock transfer portion 120 for transferring the clock from the clock supply portion 110 to each of elements in the memory device. The clock transfer portion 120 is composed of plural repeaters 121 to 126 arranged at the center of lines conveying the clock for repeating the clock.

Data input/output portions 131 to 146 for inputting/outputting data in accordance with the clock are provided through the data transfer portion 120. In an ultra-high speed memory such as a GDDR5, data is inputted/outputted in synchronism with the clock (more correctly, the WCK clock signal as defined in the JEDEC specification for GDDR5), without using a separate data strobe signal DQS. Here, the data strobe signal DQS is a clock serving as a reference for timing of data transfer between a chipset and a semiconductor memory device.

Figure 2:
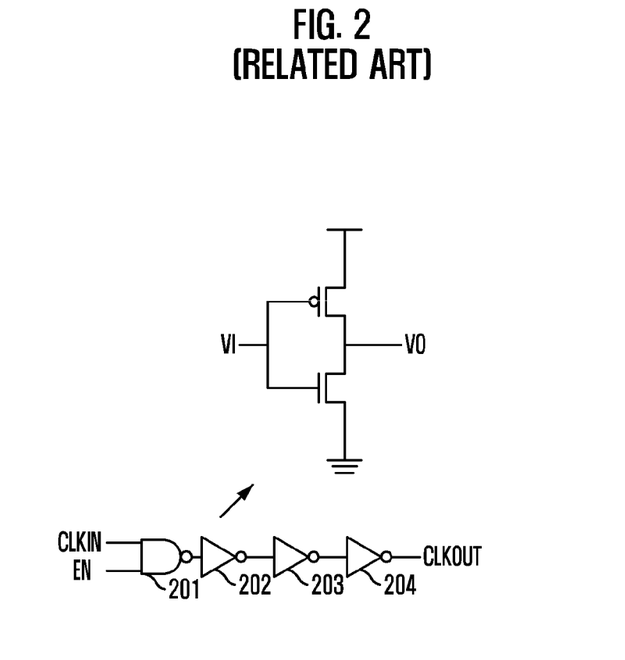
FIG. 2 is a diagram showing one of existing repeaters 121 to 126 for transferring signals at a CMOS level.

FIG. 2 is a diagram showing one of the existing repeaters 121 to 126 for transferring signals at a CMOS level.

As shown in the drawing, the existing repeater is provided with a NAND gate 201 and inverters 202, 203, and 204 for accepting an enable signal EN and a clock CLKIN.

The existing repeater conveys the clock CLKIN to its own output terminal only when the enable signal EN is enabled to a logic 'high' level. It does not convey the clock to its own output terminal when the enable signal EN is disabled to a logic 'low' level. That is, when the enable signal EN is disabled, the output terminal of the existing repeater is fixed to a logic 'low' level.

Also shown in FIG. 2 is the configuration of one of the inverters of the repeater. As is well-known in the art, an inverter may include a PMOS transistor and an NMOS transistor coupled in series. When a 'high' signal is inputted, the NMOS transistor is turned on to output to its output terminal a 'low' signal having a VSS level. On the other hand, when a 'low' signal is inputted, the PMOS transistor is turned on to output a 'high' signal having a VDD level.

The level of a signal used to drive the inverter in this way, with the 'high' signal having a VDD level and the 'low' signal having a VSS level, is called a CMOS level. In the following description, a circuit conveying a signal at a CMOS level is also referred to as a CMOS circuit.

The clock supply portion 110 and the clock transfer portion 120 in the existing semiconductor memory device are each composed of a CMOS circuit. However, such a CMOS circuit has poor noise rejection characteristics. Thus, jitter components occur in a clock signal due to power noise generated within the memory device. That is, since the existing memory device uses a CMOS circuit with poor noise immunity for clock distribution, this results in increased jitter components in the clock signal. This gives rise to a reduction in stability when the memory device operates at a high speed.

SUMMARY OF THE INVENTION

Embodiments of the present invention are directed to providing a technology of enhancing characteristics of a clock through an improved clock distribution of a semiconductor memory device.

In accordance with one aspect of the invention, a semiconductor memory device includes a clock supply portion that provides an external clock to the inside of the memory device, a clock transfer portion for transferring the clock from the clock supply portion to each of the elements in the memory device, an data output portions that output data in synchronism with the clock from the clock transfer portion, wherein the clock from the clock supply portion to the clock transfer portion swings at a Current Mode Logic (CML) level.

In accordance with another aspect of the invention, a DCC circuit of a semiconductor memory device is provided for correcting the duty of a clock to provide a corrected clock to the inside of the memory device. A clock transfer portion of the circuit transfers the clock with corrected duty to each of elements in the memory device. The DCC circuit receives a clock passed through the clock transfer portion as a feedback clock in order to detect the duty of the clock.

In accordance with a further aspect of the invention, a semiconductor memory device has a clock supply portion for providing an external clock to the inside of the memory device, a clock transfer portion for transferring the clock from the clock supply portion to each of elements in the memory device, an EDC output portion for outputting data being toggled in synchronism with the clock from the clock transfer portion and a data output portions for outputting data in synchronism with the clock from the clock transfer portion. The signal transfer path between the clock supply portion and the EDC output portion is shorter than that between the clock supply portion and the data output portions.

DESCRIPTION OF SPECIFIC EMBODIMENTS

Hereinafter, preferred embodiments in accordance with the present invention will be described in detail with reference to the accompanying drawings so that the invention can readily be practiced by those skilled in the art to which the invention pertains.

Figure 3:
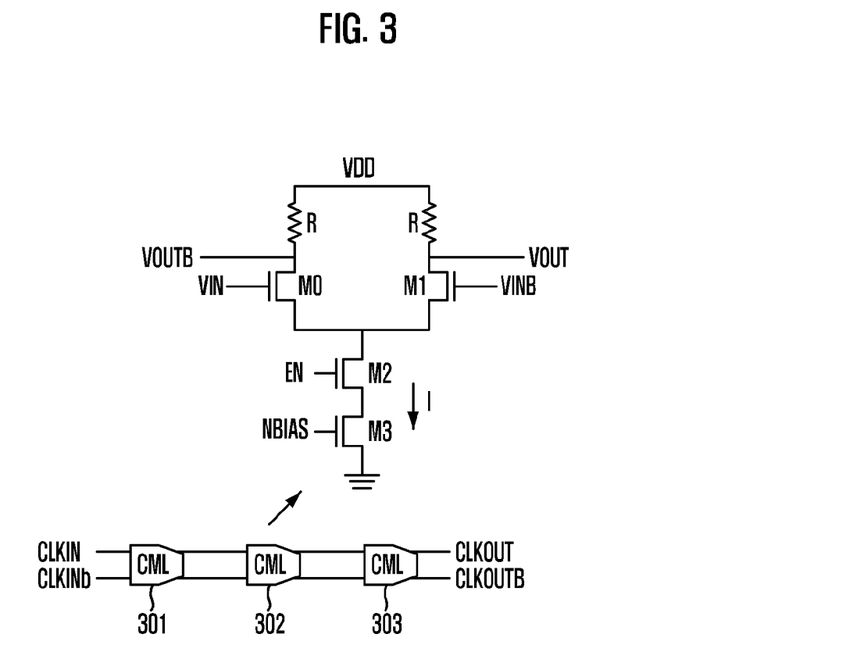
FIG. 3 is a circuit diagram for explaining a circuit operating at a CML level in accordance with the present invention.

FIG. 3 is a circuit diagram for explaining a circuit operating at a Current Mode Logic (CML) level in accordance with the invention. The circuit includes repeaters 301, 302, and 303 operating at a CML level, an internal circuit of which is shown at its upper end.

In operation, when a differential input signal VIN of logic 'high' level (VIN='high' and VINB='low') is inputted, a transistor M0 is turned on and a transistor M1 is turned off. Since the transistor M1 is turned off, no current flows into its output terminal VOUT. Thus, the voltage VOUT goes to a VDD level. In the meantime, since the transistor M0 is turned on, a current I flows into the output terminal VOUTB. Thus, VOUTB goes to a VDD−I*R level. That is to say, when the circuit operates at a CML level, the logic 'high level has a VDD level, and the logic 'low' level has a VDD−I*R level.

Meanwhile, a transistor M2 serves to enable/disable the operation of each of the repeaters 301, 302, and 303 in response to an enable signal EN applied to it. A transistor M3 serves to adjust the amount of current I in response to a bias voltage NBIAS applied to it.

Figure 4:
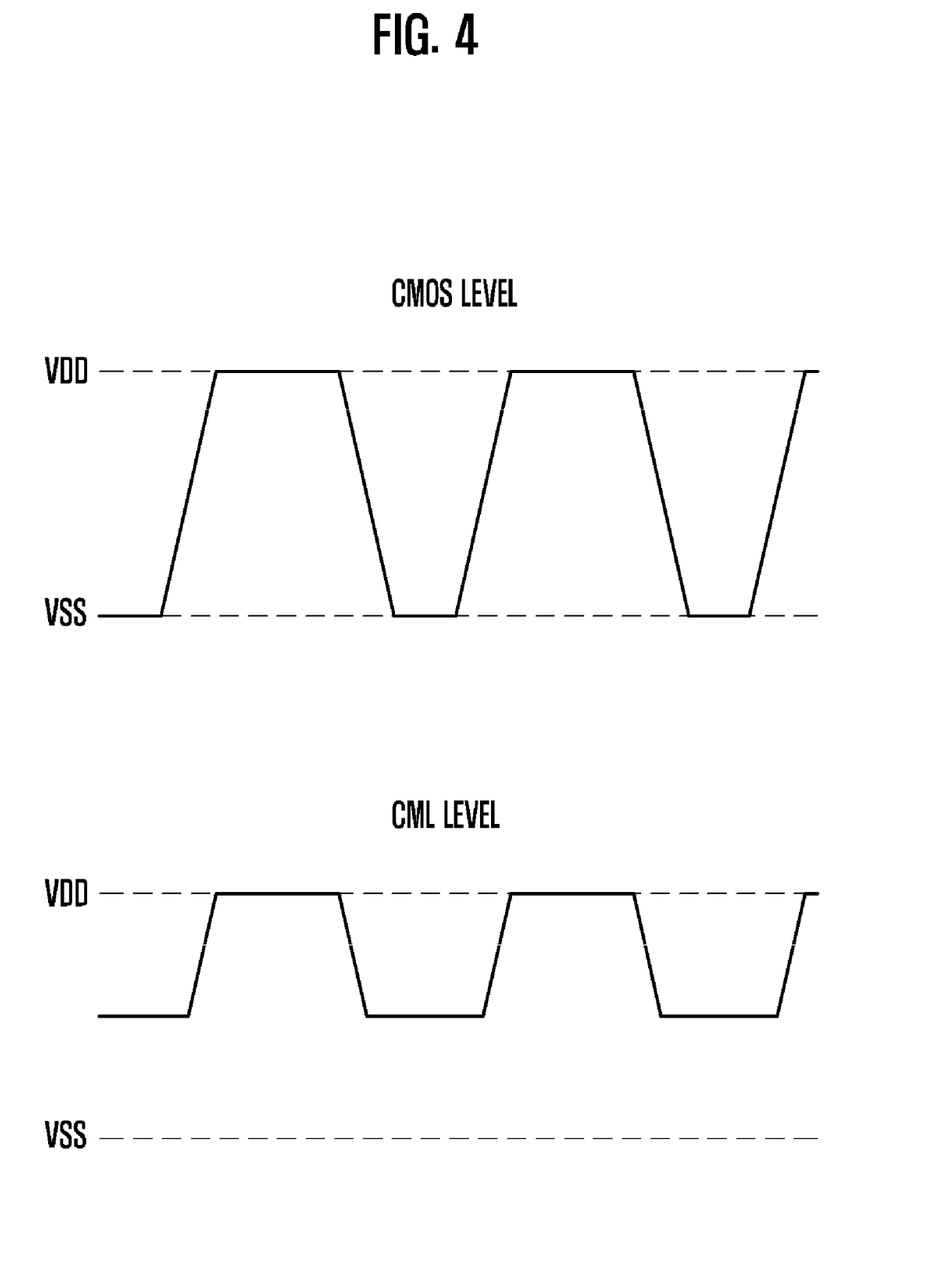
FIG. 4 is a diagram showing a difference between a CMOS level and a CML level.

The difference between a CMOS level and a CML level may be further understood by reference to FIG. 4. Only the repeaters are shown in the FIG. 3 out of diverse CML circuits because a design that allows diverse logic circuits to operate at a CML level is well known to those skilled in the art. Therefor; logic circuitry other than the repeaters will be omitted From FIG. 3 for simplicity.

Now, a description will be made for a circuit in which a signal is transferred at a CML level, namely, the features of a CML circuit. First, the CML circuit has the following features.

1. A voltage of the CML circuit has a small swing level.
2. Only a constant current is consumed regardless of frequency. Since the typical CMOS circuit has a structure that consumes current whenever an input signal (clock) is toggled, current consumption is increased as the frequency is high. However, the CML circuit always consumes a constant current I regardless of frequency. Therefore, the CML circuit has larger current consumption than that in the CMOS circuit at a low frequency, but has smaller current consumption than that in the CMOS circuit as frequency is high.
3. Since the CML circuit has a differential structure, it is strong in noise immunity.
4. Since the CML circuit does not generate a dynamic current component, it minimizes the generation of noise to peripheral circuits.
5. The design is easy.
6. After the CML circuit is designed, it is possible to use a method for scaling the size of the circuit while maintaining a beta ratio similar to that of a CMOS circuit.

Figure 5:
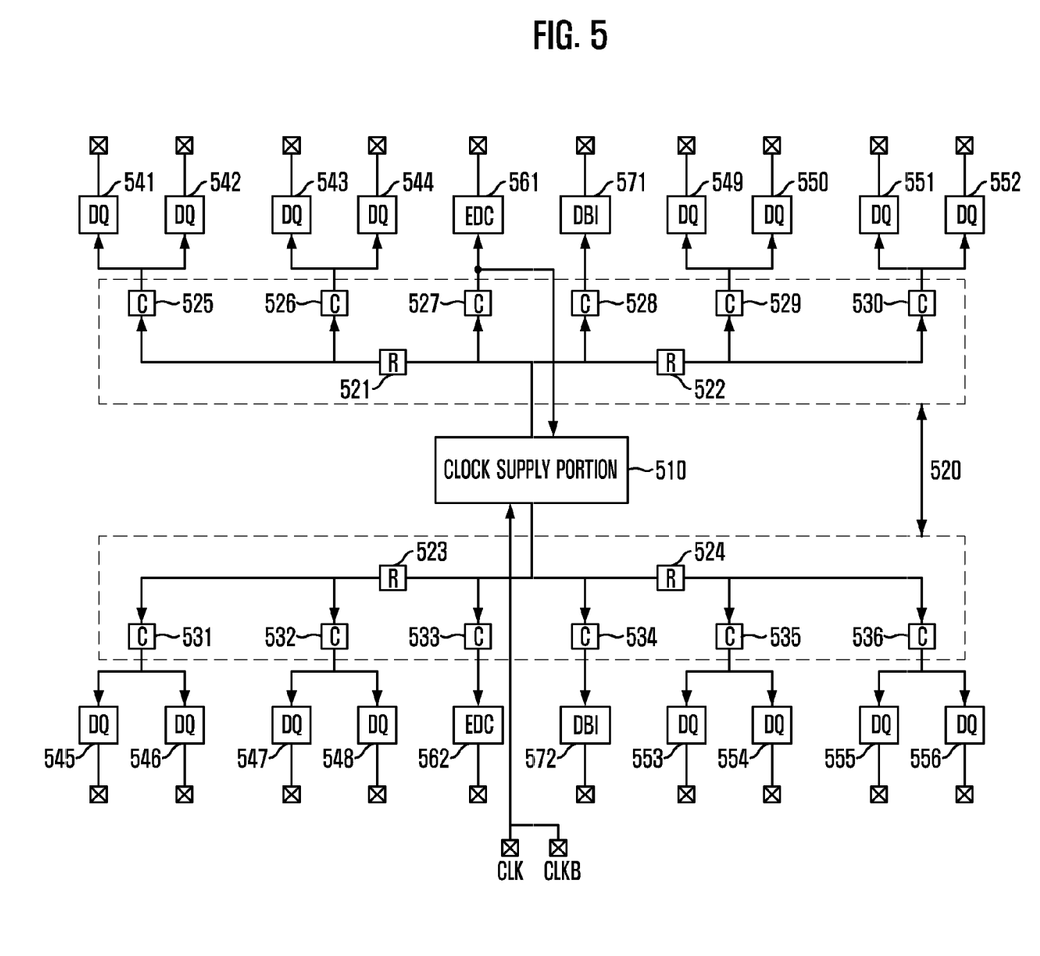
FIG. 5 is a diagram showing that a clock distribution network in accordance with the invention is applied to a GDDR5 semiconductor memory device.

FIG. 5 is a diagram showing a clock distribution network in accordance with the invention applied to an ultra-high speed semiconductor memory device.

First, details of each element shown in the drawing will be provided, and then the features of the invention will be discussed.

As shown in the drawing, the semiconductor memory device of the illustrated embodiment includes a clock supply portion 510, a clock transfer portion 520, data input/output portions 541 to 556, Error Detection Code (EDC) output portions 561 and 562, and Data Bus Inversion (DBI) output portions 571 and 572. In effect, one chip of the ultra-high speed memory device has two clock distribution networks that have the same configuration, but only one of them is shown in the drawing. Also, an ultra-high speed memory device such as GDDR5 has among its elements 32 DQs, 4 EDCs, and 4 DBIs, but for purposes of illustration is shown in the drawing with only 16 DQs, 2 EDCs, and 2 DBIs.

The clock supply portion 510, that is a portion through which a clock to be used within a chip passes first, receives an external clock via clock pads CLK and CLKB to supply it to the inside of the memory device. The clock supply portion 510 includes among its elements a buffer for receiving a clock from outside of a chip, a PLL for generating a clean clock when high jitter exists in the clock from the outside, and a DCC circuit for correcting a duty of the clock. The ultra-high speed memory device uses the clock from the outside as it is, or the clock from the PLL within the chip. A more detailed description of the clock supply portion 510 will be given later with reference to its detailed drawing, FIG. 6.

The clock transfer portion 520 transfers the clock from the clock supply portion 510 to each of the elements, i.e., each portion needing it, within the memory device. The clock transfer portion 520 is provided with lines, repeaters 521, 522, 523 and 524 for conveying the clock, and level converters 525 to 536.

The data input/output portions 541 to 556 input/output data in synchronism with the clock from the clock transfer portion 520. In case of a GDDR5 memory device, data is inputted/outputted in synchronism with the clock from the clock supply portion 510, without using a separate data strobe signal DQS. In case of DDR2 and DDR3 memory devices, data is outputted in synchronism with the clock from the clock transfer portion 520, but data is received in synchronism with a clock from an external chipset. Thus, the data input portion and the data output portion use different clocks. That is, the data input portion and the data output portion may use the same clock or a different clock depending on the type and specification of the memory device. However, it is common in most memory devices that data output is performed in synchronism with the clock that is supplied from the clock supply portion 510 and transferred to the clock transfer portion 520.

The EDC output portions 561 and 562 always output data being toggled via an EDC pin. Outputted via the EDC pin are data being consecutively toggled, like 'high', 'low', 'high', and 'low'.

Since the EDC is defined in the JEDEC specification for an ultra-high speed memory, details thereof will be omitted here.

The DBI output portions 571 and 572 outputs DBI information through a DBI pin. The DBI information is information indicating whether data outputted from the memory device is inverted data or not. Since DBI is also defined in the JEDEC specification for an ultra-high speed memory, further details thereof will be omitted here.

The invention includes three important features in order to improve characteristics of the clock signal.

As a first feature, the invention transfers a clock signal through a CMA circuit when it does so internally in the semiconductor memory. In the drawing, each of the clock supply portion 510 and the clock transfer portion 520 consists of a CML circuit. Thus, the clock swings at a CML level and is transferred to desired portions.

Within the semiconductor memory device, a clock is delivered by a CML circuit. Therefore, the clock is less affected by noise compared to the case of delivering it by the existing CMOS circuit, thereby reducing jitter components in the clock.

In the semiconductor memory device, data is inputted/outputted at a CMOS level. Therefore, each of the data input/output portions 541 to 556 consists of a CMOS circuit. Thus, the level converters 525 to 536 are provided at a clock output end of the clock transfer portion 520. Each of the level converters 525 to 536 converts into a CMOS level the clock transferred at a CML level through the clock transfer portion 520, and transfers a converted clock to the input/output portions 541 to 556. Each of the EDC output portions 561 and 562 and the DBI output portions 571 and 572 also accepts a clock signal converted to a CMOS level by the level converters 525 to 536, as in the data input/output portions 541 to 556.

Each of the level converters 525 to 536 consumes much current by its structure. Therefore, making at least two of the data input/output portions 541 to 556 share the level converters 525 to 536 can reduce the number of the level converters 525 to 536, thereby decreasing power consumption. In case a large number of data input/output portions 541 to 556 share the level converters 525 to 536, there are an increased number of paths where a clock is delivered at a CMOS level within the memory device. Therefore, the number of the input/output portions 541 to 556 that share the level converters 525 to 536 needs to be properly adjusted. For example, if the four input/output portions 541 to 544 share one level converter 525, there is an excessively increased number of paths where a clock is delivered at a CMOS level within the memory device, thus causing jitter components in the clock to increase.

A second feature of the invention is that a DCC circuit in the clock supply portion 510 receives a clock passed through the clock transfer portion 520 as a feedback clock for duty detection. As mentioned above, the DCC circuit in the clock supply portion 510 is designed for duty correction of the clock. As is well-known in the art, the DCC circuit is provided with a duty detection circuit for detecting the degrees of mismatch in duty cycles, and a correction circuit for correcting the duty of clock based on the detection result from the duty detection circuit. The existing duty detection circuit detects the clock duty cycle by taking an output from the correction circuit as a feedback clock. On the contrary, the duty detection circuit of the invention detects the clock duty cycle by taking, as a feedback clock, an output from the clock transfer portion 520, rather than from the correction circuit.

More specifically, the existing DCC circuit detects the clock duty cycle by using an output from the DCC circuit itself as a feedback clock, and corrects the clock duty cycle based on the detection result. However, the DCC circuit of the invention detects the clock duty cycle by taking, as a feedback clock, a clock that is outputted from the DCC circuit itself and then transferred to other elements in the memory device through the clock transfer portion 520, without immediately taking a clock that is outputted from the DCC circuit itself. Therefore, the DCC circuit of the invention can correct the clock duty cycle by reflecting even a mismatch in duty cycles that occurs after passing through the clock transfer portion 520. As a result, the memory device can use a clock with a more precise duty ratio.

The DCC circuit may take a clock transferred to the data input/output portions 541 to 556 as a feedback clock, but preferably receives a clock transferred to the EDC output portions 561 and 562 as a feedback clock (in the drawing, it is illustrated that feedback is made from the input of EDC 561 to the clock supply portion 510).

This is because the clock is virtually transferred to the data input/output portions 541 to 556 only when data is inputted/outputted for current saving, but the EDC output portions 561 and 562 always receive a clock being toggled according to its characteristics. Needless to say, the DCC circuit may normally operate even if it takes a clock transferred to the data input/output portions 541 to 556 as a feedback clock as long as a memory device uses a method for always transferring a clock being toggled to them.

A third feature of the invention is that the clock supply portion 510 is arranged nearer to the EDC output portions 561 and 562 than to the data input/output portions 541 to 556. That is, the signal transfer path between the clock supply portion 510 and the EDC output portions 561 and 562 is shorter than that between the clock supply portion 510 and the data input/output portions 541 to 556. Therefore, no signal amplifying circuit, such as repeater, is needed between the clock supply portion 510 and the EDC output portions 561 and 562.

As discussed earlier, the clock transfer portion 520 includes lines for carrying a clock, and repeaters 521 to 524 for repeating the clock. In addition, as shown in FIG. 2, the repeaters 521 to 524 can control whether to transfer a clock in response to an enable signal EN.

Since the clock supply portion 510 is arranged nearer to the EDC output portions 561 and 562 than to the data input/output portions 541 to 556, the clock is transferred to the EDC output portions 561 and 562, without passing through the plural repeaters 521 to 524. Therefore, the clock is always transferred to the EDC output portions 561 and 562 even if the plural repeaters 521 to 524 are disabled in response to the enable signal EN. On the contrary, when the repeaters 521 to 524 are disabled, the clock is not transferred to the data input/output portions 541 to 556.

While the clock transferred to the EDC output portions 561 and 562 always should be toggled, the clock to the data input/output portions 541 to 556 needs to be toggled only when data is virtually inputted/outputted. Thus, an effective clock control is possible, provided the enable signal EN for the repeaters 521 to 524 can be controlled to be enabled only when data is inputted/outputted. That is, arranging the EDC output portions 561 and 562 and the data input/output portions 541 to 556 as in the third feature can effectively control the clock being transferred.

In addition to the EDC output portions 561 and 562, arranging the DBI output portions 571 and 572 nearer to the clock supply portion 510 than are the data input/output portions 541 to 556 can effectively control the clock. That is to say, out of the elements in the memory device, elements that always need a clock being toggled are arranged near the clock supply portion 510, while elements that do not always need a clock being toggled are arranged far from the clock supply portion 510. By doing so, it is possible to control the clock more effectively.

Figure 6:
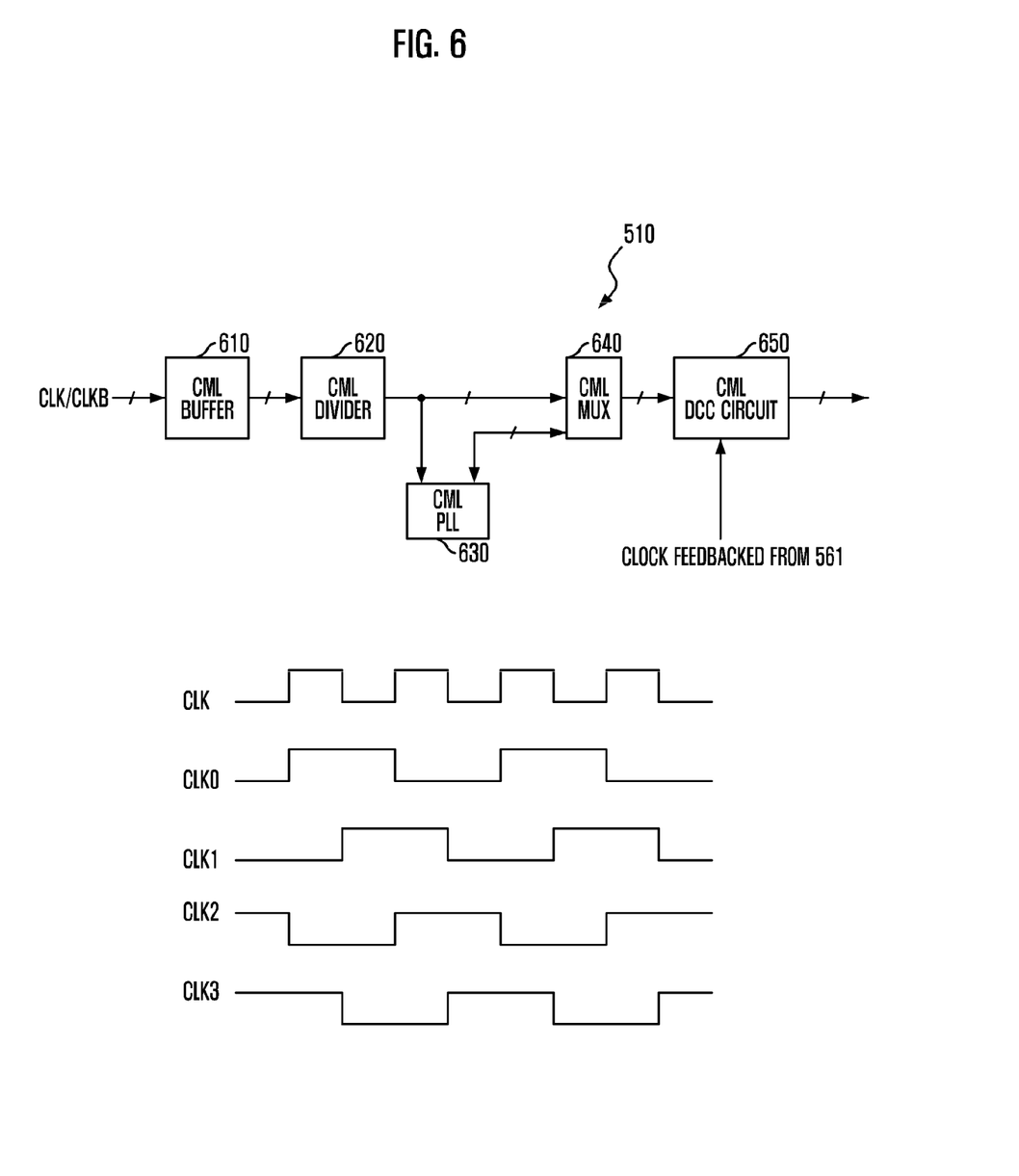
FIG. 6 is a block diagram showing details of the clock supply portion 510 in FIG. 5.

FIG. 6 is a diagram showing an internal configuration of the clock supply portion 510 in FIG. 5. Referring to the drawing, the clock supply portion 510 includes a buffer 610, a divider 620, a PLL 630, a multiplexer 640, and a DCC circuit 650.

The buffer 610 receives a clock applied to clock pads CLK and CLKB. In the drawing, "CML" indicates that the buffer 610 consists of a CML circuit and the clock swings at a CML level.

The divider 620 divides the clock CLK applied to the buffer 610. The divider 620 generates four divided clocks CLK0, CLK1, CLK2, and CLK3 with a ½ frequency of the input clock CLK and different phases. The reason for the clock division is to reduce power consumption and to prevent reduction in clock characteristics. In general, the divided clocks CLK0, CLK1, CLK2, and CLK3 are provided to the inside of the memory device. And elements that need the original clock CLK, not the divided clocks CLK0, CLK1, CLK2, and CLK3, create and utilize it based on the divided clocks CLK0, CLK1, CLK2, and CLK3. The input clock CLK and its divided clocks CLK0, CLK1, CLK2, and CLK3 are shown at the lower side of the drawing. In the drawing, CML indicates that the divider 620 is composed of a CML circuit and the clock swings at a CML level.

The PLL 630 generates a clock with a fixed frequency. That is, it basically generates the same clock as the input clock, but generates a clock having high frequency jitters removed and with realigned phase. In other words, the PLL 630 generates a clock that is cleaner than the original input clock. In the drawing, CML indicates that the PLL 630 is composed of a CML circuit and the clock swings at a CML level.

The multiplexer 640 selectively outputs one of the clocks from the divider 620 or the clock from the PLL 630. If the input clock from the outside has good characteristics, the multiplexer 640 selectively outputs any of the clocks from the divider 620; otherwise, it outputs the clock from the PLL 630. The contents as noted above are defined in the JEDEC specification for the ultra-high speed memory. In the drawing, CML indicates that the multiplexer 640 is composed of a CML circuit and the clock swings at a CML level.

The DCC circuit 650 corrects the duty cycle of the clock from the multiplexer 640. As described earlier, the DCC circuit 650 is composed of a duty detection circuit for detecting the duty of the clock, and a correction circuit for correcting the duty of the clock depending on the detection result from the duty detection circuit. The duty detection circuit of the invention detects the duty of the clock by using the clock fed back from the clock transfer portion 520. The drawing illustrates that the clock transferred from the clock transfer portion 520 to the EDC output portion 561 is fed back to the DCC circuit 650. Also, in the drawing, CML indicates that the DCC circuit 650 is composed of a CML circuit and the clock swings at a CML level.

FIG. 6 shows that the clock supply portion 510 supplies the clock to each of the elements in the memory device through the PLL 630. In case of a GDDR5 memory device, the clock supply portion 510 has the configuration as above. In case of DDR2 and DDR3 memory devices, the clock supply portion 510 uses DLL instead of PLL. It will easily be appreciated by those skilled in the art that the clock supply portion 510 can be designed based on the type of memory devices and specification. Therefore, further details thereof will be omitted here.

Figure 7:
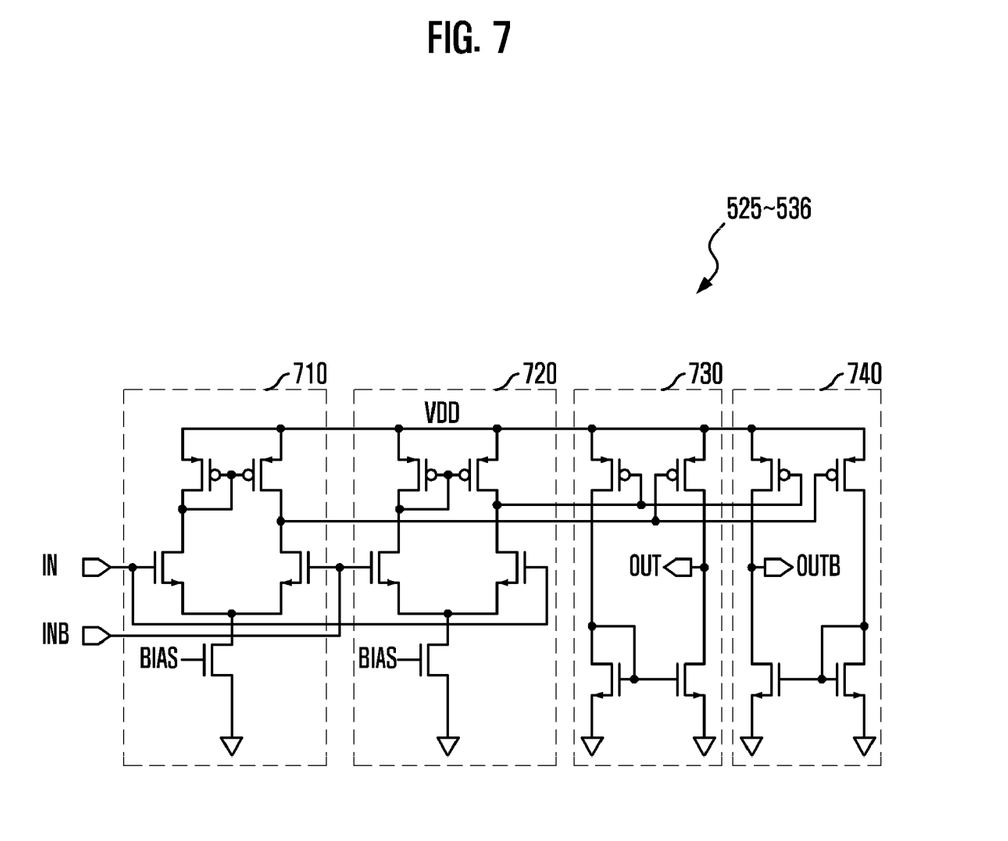
FIG. 7 is a circuit diagram showing details of one of the level converters 525 to 536 in FIG. 5.

FIG. 7 is a circuit diagram showing details of one of the level converters 525 to 536 depicted in FIG. 5. Each of the level converters 525 to 536 serves to convert an input signal having a CML level into a CMOS level. As shown in the drawing, each of the level converters 525 to 536 is provided with current mirrors 710 and 720 coupled in parallel for accepting input signals IN and INB, and current mirrors 730 and 740 coupled in parallel for generating output signals OUT and OUTB in response to outputs from the current mirrors 710 and 720.

Although each of the level converts 525 to 536 takes the input signals IN and INB that swing at a CML level, it generates output signals OUT and OUTB that full-swing at a VDD-VSS level, i.e., a CMOS level.

As described above, each of the level converters 525 to 536 is composed of a number of current mirrors 710 to 740, and therefore, it consumes relatively much current. Since the operation of each of the level converters 525 to 536 is well-known to those skilled in the art, details thereof will be omitted here.

It is natural that the invention is also applicable to various existing memory devices such as DDR, graphic memory (GDDR), mobile memory, etc., as well as future memory devices.

As described above, the semiconductor memory device in accordance with the invention can reduce jitter that occurs during clock distribution to improve characteristics of clock, thereby securing a stable operation of the memory device. In addition, the semiconductor memory device in accordance with the invention allows a DCC circuit to receive a clock passed through a clock transfer portion as a feedback clock, thus making it possible to correct a mismatch in duty cycles that is caused by clock transfer. Moreover, the semiconductor memory device in accordance with the invention efficiently arranges data output portions, EDC output portions, and a clock supply portion, so that it can efficiently control a clock delivered to each of the elements in the memory device.

While the invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a clock supply unit configured to provide an external clock to the interior of the memory device;
   a clock transfer unit configured to transfer the clock from the clock supply unit to elements in the memory device; and
   a plurality of data output units configured to output data in synchronism with the clock from the clock transfer unit,
   wherein the clock provided from the clock supply unit to the clock transfer unit swings at a current mode logic (CML) level.

2. The semiconductor memory device as recited in claim 1, wherein the clock transfer unit has a level converter arranged at its clock output end to convert the clock with a CML level into a clock with a CMOS level.

3. The semiconductor memory device as recited in claim 2, wherein the level converter is shared by at least two of the plurality of data output units.

4. The semiconductor memory device as recited in claim 1, wherein the clock supply unit includes a duty cycle correction (DCC) circuit to correct the duty cycle of the clock, the DCC circuit receiving a clock passed through the clock transfer unit as a feedback clock in order to detect the duty cycle of the clock.

5. The semiconductor memory device as recited in claim 1, wherein the clock supply unit includes:
   a buffer configured to buffer the external clock;
   a phase locked loop configured to generate a clock with a fixed frequency;
   a multiplexer configured selectively to output the clock from the buffer or the clock from the phase locked loop; and
   a DCC circuit configured to correct the duty cycle of the clock outputted from the multiplexer to provide a corrected clock.

6. A semiconductor memory device, comprising:
   a DCC circuit configured to correct the duty cycle of a clock to provide a corrected clock to the interior of the memory device;
   a clock transfer unit configured to transfer the corrected clock to elements in the memory device,
   wherein the DCC circuit receives a clock passed through the clock transfer unit as a feedback clock in order to detect the duty cycle of the clock, and wherein the DCC circuit and the clock transfer unit operate at a CML level.

7. The semiconductor memory device as recited in claim 6, further comprising:
a plurality of data output units configured to output data in synchronism with the clock from the clock transfer unit; and
an error detection code (EDC) output unit configured to output data in synchronism with the clock from the clock transfer unit,
wherein the clock that the DCC circuit receives as a feedback clock is the same clock used by the EDC output unit.

8. The semiconductor memory device as recited in claim 7, wherein the clock transfer unit always-continuously transfers the clock to the EDC output unit, and selectively transfers the clock to the data output units.

9. The semiconductor memory device as recited in claim 8, wherein the clock transfer unit transfers the clock to the data output units when the data is outputted.

10. A semiconductor memory device, comprising:
a clock supply unit configured to provide an external clock to the interior of the memory device;
a clock transfer unit configured to transfer the clock from the clock supply unit to elements in the memory device;
an EDC output unit configured to output data in synchronism with the clock from the clock transfer unit; and
a plurality of data output units configured to output data in synchronism with the clock from the clock transfer unit,
wherein the signal transfer path between the clock supply unit and the EDC output unit is shorter than that between the clock supply unit and the data output units.

11. The semiconductor memory device as recited in claim 10, wherein the clock transfer unit continuously transfers the clock to the EDC output unit, and selectively transfers the clock to the data output units.

12. The semiconductor memory device as recited in claim 11, wherein the clock transfer unit includes a line configured to convey the clock, and a repeater configured to repeat the clock on the line in response to an enable signal.

13. The semiconductor memory device as recited in claim 10, wherein the clock supply unit and the clock transfer unit operate at a CML level, and the EDC output unit and the data output units operate at a CMOS level.

14. The semiconductor memory device as recited in claim 13, wherein the clock supply unit includes a DCC circuit configured to correct the duty cycle of the clock, wherein the DCC circuit receives the clock passed through the clock transfer unit as a feedback clock in order to detect the duty cycle of the clock.

15. The semiconductor memory device as recited in claim 14, wherein the clock that passes through the clock transfer unit and is received by the DCC circuit as a feedback clock, is the same clock used by the EDC output unit.

16. The semiconductor memory device as recited in claim 14, further comprising a data bus inversion (DBI) output unit configured to output DBI information indicating whether data is inverted or not in synchronism with the clock from the clock transfer unit, wherein the clock supply unit is arranged nearer to the DBI output unit than to the data output units.

* * * * *